(12) United States Patent
Kudo

(10) Patent No.: US 6,653,667 B2
(45) Date of Patent: Nov. 25, 2003

(54) GAAS-BASED SEMICONDUCTOR FIELD-EFFECT TRANSISTOR

(75) Inventor: Akiyoshi Kudo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/186,614

(22) Filed: Jul. 2, 2002

(65) Prior Publication Data

US 2003/0006426 A1 Jan. 9, 2003

(30) Foreign Application Priority Data

Jul. 6, 2001 (JP) ......................................... 2001-206165

(51) Int. Cl.[7] ...................... H01L 31/0328; H01L 29/80
(52) U.S. Cl. ...................... 257/192; 257/194; 257/187; 257/280; 257/282; 257/283; 257/284
(58) Field of Search ................................ 257/192, 194, 257/187, 280, 282, 283, 284

(56) References Cited

U.S. PATENT DOCUMENTS

| | | | |
|---|---|---|---|
| 5,471,073 A | 11/1995 | Kohno | |
| 5,486,710 A | 1/1996 | Kitano | |
| 5,530,272 A | 6/1996 | Kudo et al. | |
| 5,548,144 A | 8/1996 | Kohno | |
| 5,585,289 A | 12/1996 | Kitano | |
| 5,880,483 A | 3/1999 | Shanfield et al. | |
| 5,886,373 A | 3/1999 | Hosogi | |
| 5,942,792 A | 8/1999 | Miyoshi | |
| 6,060,734 A | 5/2000 | Kunihiro | |
| 6,100,547 A | 8/2000 | Matsushita | |
| 6,180,968 B1 | 1/2001 | Kasahara et al. | |

FOREIGN PATENT DOCUMENTS

| | | |
|---|---|---|
| JP | 4-17340 | 1/1992 |
| JP | 5-55263 | 3/1993 |
| JP | 7-130990 | 5/1995 |
| JP | 10-335352 | 12/1998 |

OTHER PUBLICATIONS

Sasaki et al., "Analysis of gate Lag in GaAs Metal–semiconductor field–effect transistor using light illumination", Jpn.J.Appl.Phys., (1995) Dec., Part 1, vol. 34, No. 12A, pp. 6346–6351.*

Lee, Jong–Lam et al., "Improvement of breakdown characteristics of a GaAs power field–effect transistor using $(NH_4)_2S_x$ treatment", 931 Journal of Applied Physics, (1993) Apr., vol. 73, No. 7, pp. 3539–3542.

Chang, Edward Y. et al., "Passivation of GaAs FET's with PECVD Silicon Nitride Films of Different Stress States", 8093 I.E.E.E. Transactioins on Electron Devices, (1988) Sep., vol. 35, No. 9, pp. 1412–1418.

Sasaki, Hajime et al., "Analysis of Gate Lag in GaAs Metal–Semiconductor Field–Effect Transistor Using Light Ilumination", Jpn. J. Appl. Phys., (1995) Dec., Part 1, vol. 34, No. 12A, pp. 6346–6351.

(List continued on next page.)

Primary Examiner—Minh Loan Tran
Assistant Examiner—Tan Tran
(74) Attorney, Agent, or Firm—Leydig, Voit & Mayer, LTD

(57) ABSTRACT

A GaAs-based semiconductor field-effect transistor in which electrons flowing from a source electrode to a drain electrode are controlled by a signal supplied to a gate electrode. The transistor includes an active layer made of a GaAs-based semiconductor material. A source electrode and a drain electrode are formed on the active layer. A gate electrode is formed on the active layer between the source electrode and the drain electrode. The thickness of an oxide layer of the GaAs-based semiconductor material on the active layer is approximately equal to the lattice constant of the GaAs-based semiconductor material. The thickness of the oxide layer is preferably about 4 through 6 Å, and, more preferably, about 5 Å.

6 Claims, 5 Drawing Sheets

OTHER PUBLICATIONS

Horio, K. et al., "Analysis of Surface–Related Deep–Trap Effects on Gate–Leg Phenomena in GaAs MESFETs", GaAs IC Symposium, pp. 175–178.

Mun, Joseph; GaAs Integrated Circuits, *BPS Professional Books*, pp. 62–67.

Zhao, Jian H.; "Modeling the Effects of Surface States on DLTS Spectra of GaAs MESFETs", *IEEE Transactions on Electron Devices*, vol. 37, No. 5, (May 1990).

Huang, J. et al.; "AlGaAs/InGaAs Pseudomorphic . . . Power Applications", *IEEE Transactions on Microwave Theory and Techniques*, vol. 41, No. 5, (May 1993).

Hwang, James C.M.; "Relationship between gate . . . electron mobility transistors", *Solid–State Electronics* 43, pp. 1325–1331, (1999).

Ikoma, Hideaki; "Passivation Technique for Compound Semiconductor", *Oyo–Butsuri*, vol. 69, No. 2, pp. 159–165, (2000).

Fukuda, M. et al.; "Basics of GaAs Field Effect Transistor", pp. 129–131, 200–205, (Feb. 1992).

Kohno, Y. et al.; "Modeling and Suppression of . . . Dispersions in GaAs MESFETs", *IEEE GaAs IC Symposium*, pp. 263–266, (1994).

Horio, K.; "Analysis of Surface–Related Deep–Trap Effects on Gate–Lag Phenomena in GaAs MESFETs", *IEEE GaAs IC Symposium*, pp. 175–178, (1996).

Ueda, D.; "Surface Passivation of GaAs Power FETs", *Proceedings of the Materials Research Society Symposium*, vol. 573, (Apr. 5–7, 1999).

Dang, X. et al.; "Long Time–Constant Trap Effects in Nitride Heterostructure Field Effect Transistors", *Mat. Res. Soc. Symp.*, vol. 622, pp. T.6.28.1–T6.28.6, (2000).

Hasegawa, H.; "Present status and key issues of surface passivation of III–V compound semiconductors—from semi–classical regime to quantum device regime", *II Intl. Seminar on Semiconductor Surface Passivation*, Poland, (Sep. 10–13, 2001).

* cited by examiner

GAAS-BASED SEMICONDUCTOR FIELD-EFFECT TRANSISTOR

CROSS-REFERENCE TO RELATED APPLICATIONS

Commonly assigned Japanese Patent Application No. 2001-206165 filed on Jul. 6, 2001, is incorporated by reference into the present patent application.

BACKGROUND OF THE INVENTION

1. Field of the Invention

The present invention relates to a GaAs-based semiconductor field-effect transistor.

2. Description of the Related Art

In manufacturing a GaAs-based field effect transistor (FET), after forming source and drain electrodes and a recess in an active layer of GaAs, a gate metal is deposited using a photoresist mask. The photoresist mask has an aperture at a central portion of the recess. Excess metal on the photoresist mask and the mask are lifted off to create a gate electrode. Then, a passivation film is deposited, completing manufacture of a GaAs field-effect transistor. When the lift-off method is used, after removal of the photoresist, residues of the photoresist are completely eliminated by ashing with an oxygen plasma or photo-ozone. Further, in the GaAs field-effect transistor, trapping and releasing of electrons attributed to the surface (interface) states of GaAs gives rise to a gate lag phenomenon (a pulse delay) of the transistor (See "Hideaki IKOMA, Applied Physics, 69 (2000) p.159").

Noting this, various methods have been tried to avoid influences of the surface (interface) states at the recess in the surface of the GaAs active layer. For instance, the following attempts have been proposed: suppressing trapping and releasing of electrons at and to the surface states of GaAs through a surface modification treatment, using ammonium sulfide or a nitrogen plasma, applied to the GaAs surface; burying the gate electrode in the recess (i.e., a GaAs-based field-effect transistor with a buried gate structure); and a two-step recess structure (a two-step recess transistor), such as generally denoted at the reference numeral 500 in FIG. 7.

In the two-step recess transistor 500, a GaAs buffer layer 502, a GaAs active layer 503 and a GaAs contact layer 504 are successively disposed on a GaAs semi-insulating substrate 501. A two-step recess 505 is formed in the GaAs active layer 503, and a gate electrode 506 is disposed at the center of the two-step recess 505. Further, source and drain electrodes 507 are formed on the GaAs contact layer 504 on opposite sides of the gate electrode 506. In addition, a passivation film 508 of SiN is deposited to protect the surface.

In the two-step recess transistor 500, it is possible to reduce the width of the recess, in effect, in the vicinity of the gate electrode, reduce trapping and releasing of electrons in the surface states of GaAs on the surface depletion layer, which expands and contracts, in response to the gate-bias (Vg) supplied to the gate electrode, thereby lessening the pulse delay.

However, the two-step recess transistor 500 requires complicated manufacturing processes, causing a decrease in yield. Further, the gate-drain breakdown voltage decreases since the recess width becomes narrower, in effect, in the vicinity of the gate electrode.

The inventor has found that the pulse delay phenomenon is not attributable to trapping and releasing of electrons in surface (interface) states of GaAs, but is due to leakage currents in the vicinity of a GaAs oxide layer formed on the surface of the recess in the ashing step after the lift-off step. The inventor found that the leakage currents (changes in quantities of electrons) in the GaAs oxide layer contributes to changes in surface depletion layer thickness, gate lag, and gate-drain breakdown voltage, etc.

In other words, the conventional two-step recess transistor has a narrower width recess, in effect, thereby reducing the influence of the GaAs oxide layer formed on the surface of the recess.

SUMMARY OF THE INVENTION

The present invention relates to GaAs-based field-effect transistors, and improved performance, such as a reduction in gate-lag, controllability of gate breakdown voltage, and improvement in noise characteristics.

The inventor found that the gate-lag effect is reduced when the thickness of the GaAs oxide layer between the surface of GaAs and the passivation film is reduced. The thickness of the GaAs oxide layer is ensured to be approximately equal to the lattice constant of a GaAs-based semiconductor material if the effectiveness of photoresist removal in a lift-off process is sufficiently improved to eliminate the ashing step. Further, as the effectiveness of photoresist removal in the lift-off process is improved and the ashing step is eliminated without adversely influencing transistor performances, various characteristics of a transistor, such as controllability of gate-drain breakdown voltage and noise characteristics improve.

More specifically, photoresist removers containing N-methyl-2-pyrrolidone (NMP) as a component make it possible to completely remove residues of photoresists to such an extent as to omit the following ashing step from the lift-off process. Accordingly, it is possible to control the thickness of a GaAs oxide layer produced as side effect in the ashing step, so the thickness of the GaAs oxide layer is approximately equal to the lattice constant of GaAs. Hence, the device performance of GaAs FETs is improved. This point of view has led the present invention.

JP 10-335352 discloses that a reduction of the pulse delay (gate-lag) occurs when the thickness of a GaAs oxide layer is 20 Å or thinner. However, the present invention reveals the realities of further improvement of various characteristics of transistors, such as controllability of gate breakdown voltages and noise as well as further reduction of the pulse delay, provided that the thickness of the GaAs oxide layer is limited to be in the approximate range of the lattice constant of GaAs.

In other words, the present invention is directed to a GaAs-based semiconductor field-effect transistor in which electrons flowing from a source electrode to a drain electrode are controlled by means of a signal supplied to a gate electrode. The transistor comprises n-doped GaAs-based semiconductor materials. A source electrode and a drain electrode are formed on an active layer of a GaAs-based semiconductor material. A gate electrode is formed on the active layer between the source electrode and the drain electrode. The thickness of the GaAs oxide layer on the active layer is approximately equal to the lattice constant of the GaAs-based semiconductor material. The thickness of the oxide layer, the thickness of the GaAs native oxide layer, is preferably about 4 through 6 Å, and more preferably about 5 Å, which is the approximate range of the lattice constant of GaAs and GaAs-based semiconductor materials.

DETAILED DESCRIPTION OF THE PREFERRED EMBODIMENTS

First Preferred Embodiment

Figure 1:
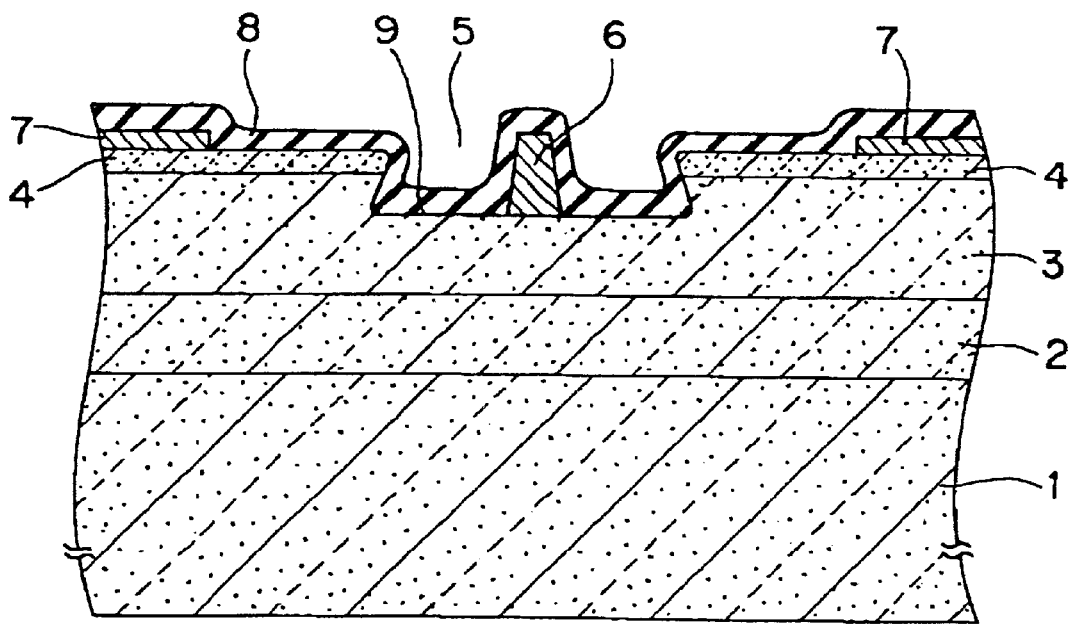
FIG. 1 is a cross sectional view of a GaAs field-effect transistor according to the first preferred embodiment of the present invention.

FIG. 1 is a cross sectional view of a GaAs field-effect transistor 100 according to a first preferred embodiment.

In the GaAs field-effect transistor 100, a GaAs buffer layer 2, an n-GaAs active layer ($10^{17}/cm^3$) 3, providing a channel layer, and an $n^+$ GaAs contact layer ($10^{18}/cm^3$) 4 are formed successively on a semi-insulating GaAs substrate 1. The $n^+$ GaAs contact layer 4 and the n-GaAs active layer 3 are partially etched, whereby a recess 5 is formed. A gate electrode 6 is disposed approximately at the center of the recess, and source and drain electrodes 7 are formed on the $n^+$ GaAs contact layer 4 on opposite sides of the gate electrode 6.

A GaAs native oxide 9 exists on the surface of the n-GaAs active layer 3 within the recess 5. The thickness of the GaAs native oxide 9 is approximately equal to the lattice constant of GaAs (5.65 Å), and, preferably, about 4 to 6 Å.

Further, a passivation film 8 of SiN is covers and protects the GaAs surface.

The method of manufacturing the GaAs field-effect transistor 100 is briefly described. The method is similar to the conventional method. The GaAs buffer layer 2, the n-GaAs active layer 3, and the $n^+$ GaAs contact layer 4 are successively formed on the semi-insulating GaAs substrate 1 by molecular beam epitaxy (MBE) or the like. The source and drain electrodes 7 are formed on the $n^+$ GaAs contact layer 4 by metal evaporation and lift-off or the like. A photoresist layer (not shown) with an aperture where the gate electrode is to be disposed is formed, and the recess 5 is formed between the source and drain electrodes by using the chemical etching method or the like.

Thereafter, the photoresist layer (not shown) is removed to form the gate electrode 6 from metals such as aluminum, etc. Thus, the gate electrode 6 is disposed at the center of the recess 5, using the metal evaporation and lift-off method or the like. Then, the passivation film of SiN is deposited by chemical vapor deposition (CVD) or the like. Instead of SiN, SiO, or SiON may alternatively be used as the passivation film.

In the conventional method, an ashing step, such as an oxygen plasma ashing or photo-ozone ashing, is needed in order to remove the residues of the photoresist completely in the formation of the gate electrode 6. In the first preferred embodiment of the present invention, however, the ashing step is not necessary since a photoresist remover including NMP as a chemical component is utilized in the lift-off step in the gate-formation process (Asherless process). When the ashing step is not done, the thickness of the GaAs oxide layer on the recess 5 is approximately 5 Å. Thereby, the GaAs field-effect transistor 100 is completed.

C-V measurements were made on the GaAs field-effect transistor 100 according to the first preferred embodiment and a conventional GaAs field-effect transistor fabricated using an oxygen plasma ashing step after the lift-off process.

Figure 2:
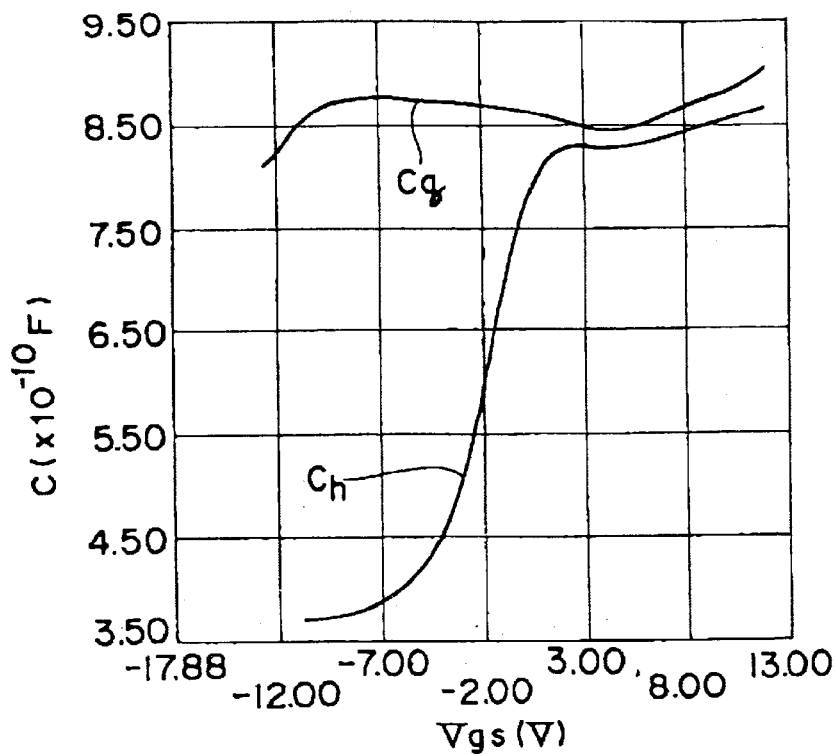
FIG. 2 shows results of a C-V measurement on an interface between a GaAs surface and a passivation film in the GaAs field-effect transistor according to the first preferred embodiment.
Figure 3:
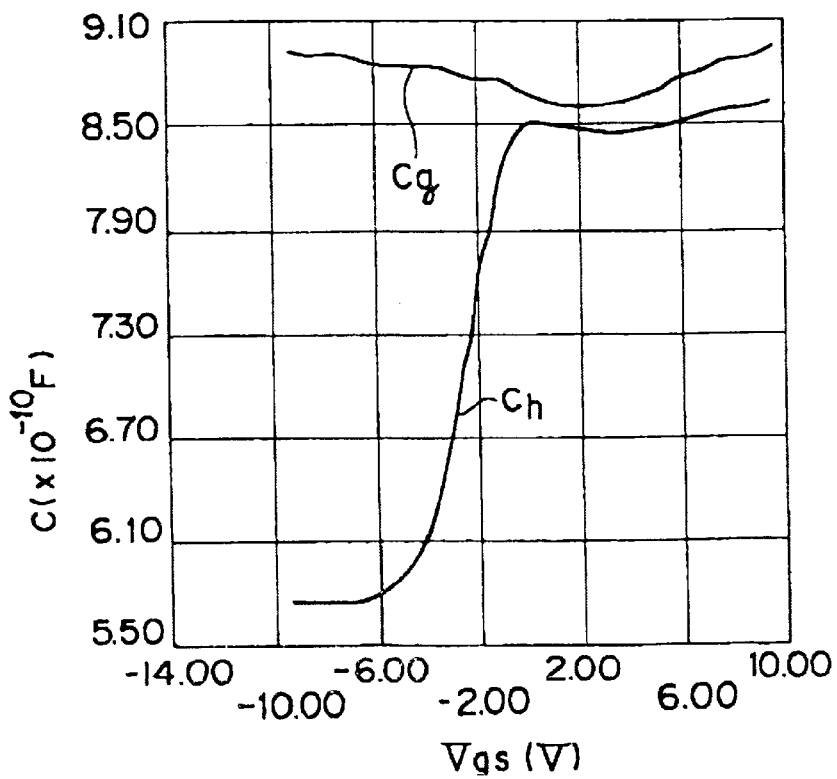
FIG. 3 shows results of a C-V measurement on the interface between the GaAs surface and the passivation film in the GaAs field-effect transistor according to the first preferred embodiment.
Figure 4:
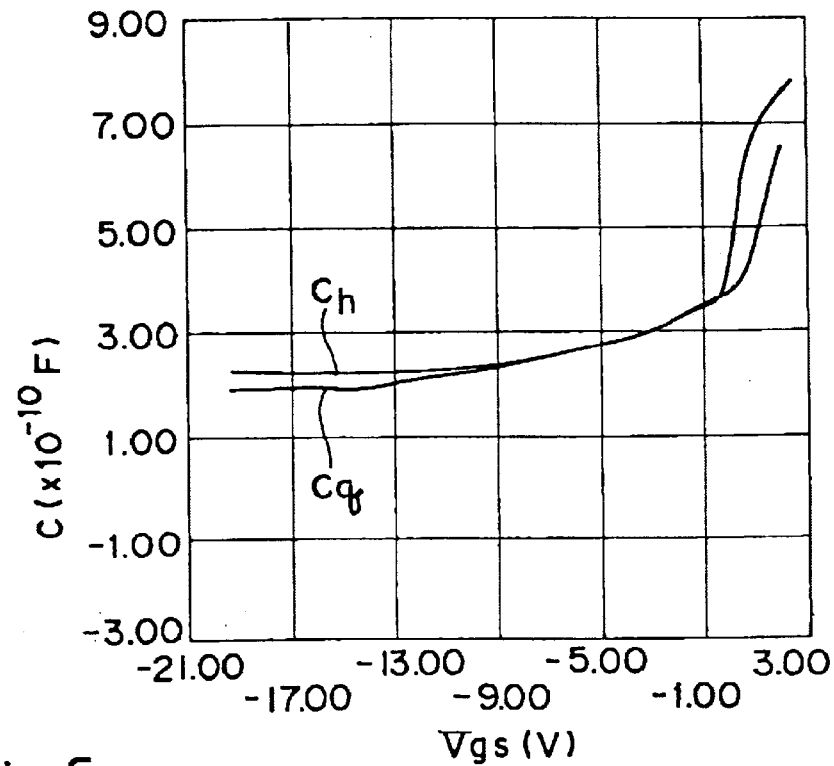
FIG. 4 shows results of a C-V measurement on an interface between a GaAs surface and a passivation film in a conventional GaAs field-effect transistor.
Figure 5:
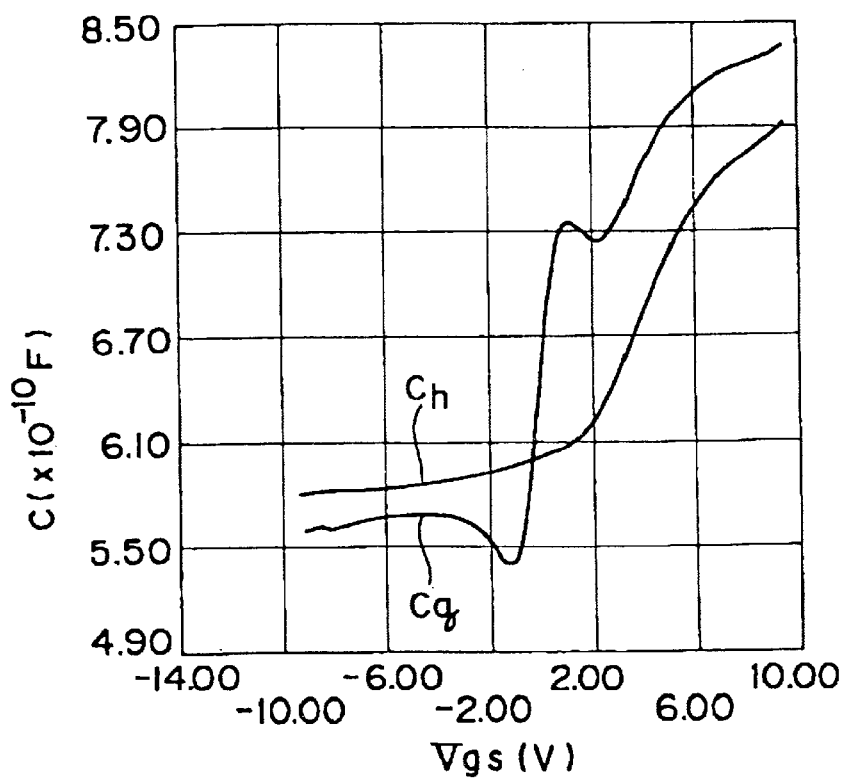
FIG. 5 shows results of a C-V measurement on the interface between the GaAs surface and the passivation film in the conventional GaAs field-effect transistor.

FIGS. 2 and 3 show measurements of the densities of the interface states between the GaAs surface and the SiN passivation film of the GaAs field-effect transistor 100 according to the first preferred embodiment. FIGS. 4 and 5 show measurements of the densities of the interface states between the GaAs surface and the SiN passivation film of the conventional GaAs field-effect transistor. A C-V measurement system with a mercury probe was used for evaluation of the densities of interface states. In these drawings, the horizontal axes denote the voltages across the probes while the vertical axes denote capacitances. The symbol Cq represents a quasi-static frequency capacitance and the symbol Ch represents a high-frequency capacitance.

FIG. 2 represents a case where n-doped GaAs epitaxial layer 3 has a dopant concentration of about $3.0 \times 10^{17}/cm^3$, while FIG. 3 represents a case where the dopant concentration is about $3.0 \times 10^{18}/cm^3$. The thickness of the GaAs oxide layer is about 5 Å. By using the C-V measurement system, the density of interface states, (Dit), is estimated as follows: Dit=$4.7 \times 10^{12}$ $cm^{-2}$ $eV^{-1}$ in the case of FIG. 2; and Dit= $2.6 \times 10^{12}$ $cm^{-2}$ $eV^{-1}$ in the case of FIG. 3. Namely, the densities are in the $10^{12}$ $cm^{-2}$ $eV^{-1}$ range, regardless of the dopant concentration of the GaAs epitaxial layer 3. A density of surface (interface) states as high as $10^{12}$ $cm^{-2}$ $eV^{-1}$ has been assumed to be a cause of the gate lag phenomenon (pulse delay). Based upon that assumption, GaAs surfaces of GaAs-based semiconductor field-effect transistors are empirically processed through a treatment using an ammonium sulfide solution or nitrogen plasma, for instance, in order to reduce the interface state density to as low as the $10^{10}$ $cm^{-2}$ $eV^{-1}$ range.

On the other hand, FIGS. 4 and 5 show C-V measurement results on the conventional GaAs field-effect transistor. FIG. 4 represents a case where n-doped GaAs epitaxial layer 3 has a dopant concentration of about $3.0 \times 10^{17}/cm^3$, while FIG. 5 represents a case where the dopant concentration is about $3.0 \times 10^{18}/cm^3$. The thickness of the GaAs oxide layer 9 produced in the ashing step is about 30 Å. FIGS. 4 and 5 have the Cq and Ch values plotted in the converse position: Cq<Ch, compared to those in FIGS. 2 and 3. This converse position: Cq<Ch means that the interface leakage occurs in the vicinity of the interface between the GaAs active layer and the passivation film. The kinked portion of the Cq plot is thought to be caused by electron traps in the vicinity of the interface between the GaAs active layer and the passivation film.

As a result of the research reported here, it was found that the pulse delay phenomenon (gate lag) is not caused by the trapping and releasing of electrons in the surface (interface) states of GaAs as considered formerly, but is principally caused by leakage in the vicinity of the GaAs oxide layer. Since the thickness of the GaAs oxide layer 9 on the GaAs epitaxial layer 3 is approximately equal to the lattice constant of GaAs in the first preferred embodiment of the present invention, it is possible to reduce the leakage at the interface between the GaAs epitaxial layer 3 and the passivation film 8. Additionally, this reduced leakage makes it possible to avoid the occurrence of gate-lag, and to suppress frequency dispersion, in which a drain current (Id), mutual conductance (gm) and the like change in accordance with frequency of a gate input signal, previously considered due to the trapping and releasing of electrons in the surface (interface) states of GaAs. Further, this reduction in leakage makes it possible to improve transistor performance, such as reducing FET noise and the like.

Unlike conventional approaches to avoid influences of GaAs surface (interface) states, such as an ammonium sulfide solution treatment or nitrogen plasma treatment, the present invention requires that the oxide layer on the GaAs surface 9 should be approximately equal to the lattice constant of GaAs (5.65 Å) or, more preferably, about 4 to 6 Å (native oxide), and that the density of surface (interface) states (Dit) of GaAs should be stabilized in a range of $10^{12}$ $cm^{-2}$ $eV^{-1}$. If the GaAs oxide layer 9 is thicker than that of native oxide, deterioration in transistor performance, such as gate-lag effects, and increases in leakage and noise occur.

As the foregoing has clearly described, the present invention realizes excellent performance in compound semiconductor devices such as field-effect transistors or bipolar transistors. By forming the oxide layer on the epitaxial layer with a thickness approximately equal to the lattice constant of the compound semiconductor, that is, the thickness of the native oxide, a reduction of leakage currents, suppression of gate-lag effects, and improvement of the controllability of gate breakdown voltage, as well as improved noise characteristics can be achieved in compound semiconductor transistors.

Second Preferred Embodiment

Figure 6:
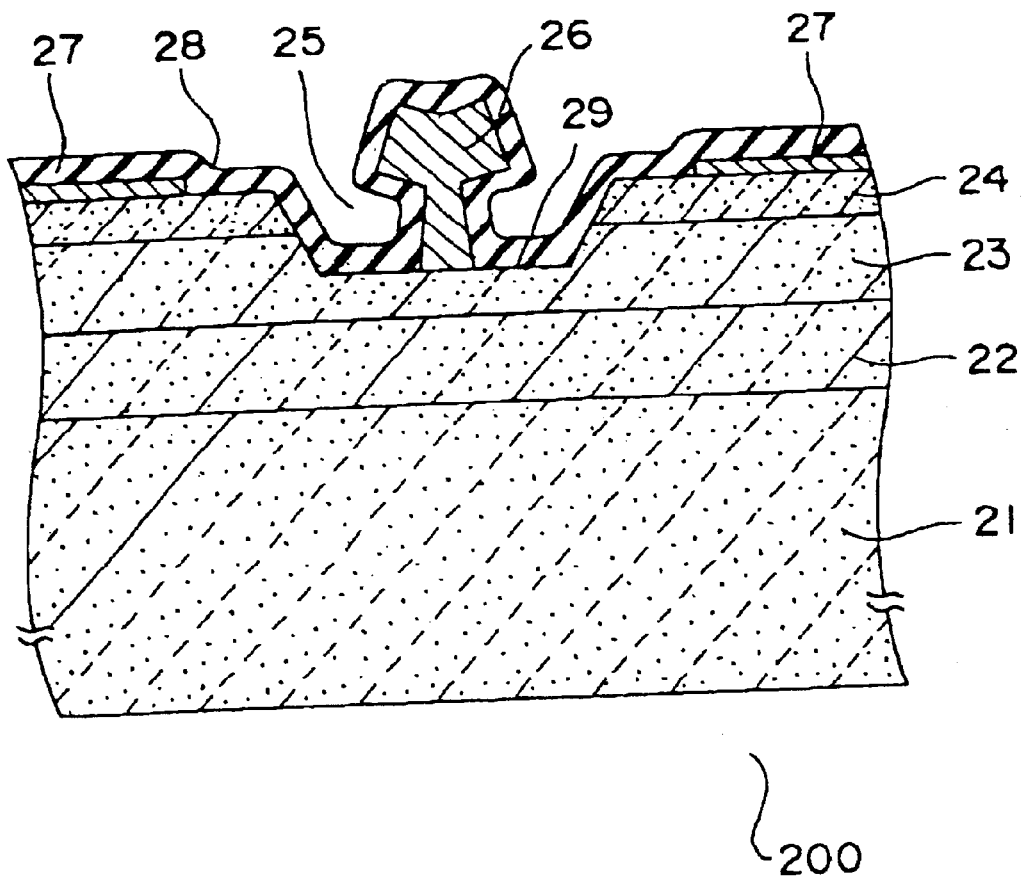
FIG. 6 is a cross sectional view of an AlGaAs/InGaAs p-HEMT according to a second preferred embodiment of the present invention.
Figure 7:
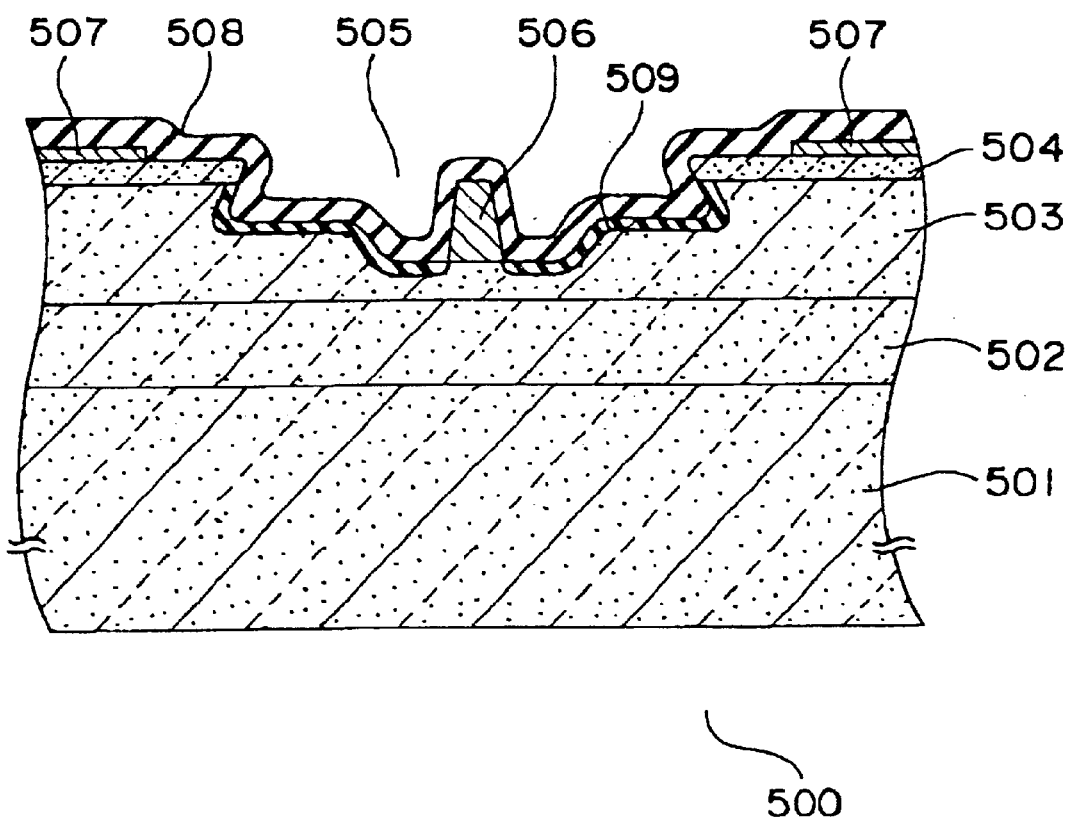
FIG. 7 is a cross sectional view of a conventional two-step recess field-effect transistor.

FIG. 6 is a cross sectional view of an AlGaAs/InGaAs p-HEMT 200 according to a second preferred embodiment.

In the p-HEMT 200, an InGaAs layer 22, an n-AlGaAs layer 23, and an n⁺ GaAs contact layer 24 are formed successively on a semi-insulating GaAs substrate 21. The n⁺ GaAs contact layer 24 and the n-AlGaAs active layer 23 are partially etched, whereby a recess 25 is formed. A gate electrode 26 is disposed approximately at the center of the recess 25, and source and drain electrodes 27 are formed on the n⁺ GaAs contact layer 24 on opposite sides of the gate electrode 26.

An AlGaAs oxide layer 29 is formed on a surface of the n-AlGaAs active layer 23 in the recess 25. The thickness of the AlGaAs oxide layer 29 is preferably the same as the lattice constant of AlAs (5.66 Å) or GaAs (5.65 Å), or most preferably, about 4 to 6 Å.

Further, a passivation film 28 of SiN is formed as a protection film, covering the surface.

In the InGaAs/AlGaAs p-HEMT 200 or the like capable of operating at a high speed, the same effect is obtained by controlling the thickness of surface (interface) oxide layer on the channel layer as in the transistor described in the first embodiment.

What is claimed is:

1. A GaAs-based semiconductor field-effect transistor in which electrons flowing from a source electrode to a drain electrode are controlled by a signal supplied to a gate electrode, comprising:

an active layer of a GaAs-based semiconductor material having a lattice constant;

a source electrode and a drain electrode on said active layer; and a gate electrode on said active layer between said source electrode and said drain electrode, wherein an oxide layer of said GaAs-based semiconductor material on said active layer has a thickness approximately equal to the lattice constant of said GaAs-based semiconductor material; and interface states proximate the surface of said active layer are present in a density of approximately $10^{12}$ $cm^{-2}$ $eV^{-1}$.

2. The GaAs-based semiconductor field-effect transistor according to claim 1, wherein said active layer includes a recess and said oxide layer of said GaAs-based semiconductor material is present on a surface of the recess.

3. The GaAs-based semiconductor field-effect transistor according to claim 1, wherein the thickness of said oxide layer is about 4 Å through 6 Å.

4. The GaAs-based semiconductor field-effect transistor according to claim 1, wherein the thickness of said oxide layer is about 5 Å.

5. The GaAs-based semiconductor field-effect transistor according to claim 1, wherein the transistor is selected from the group consisting of GaAs field-effect transistors, AlGaAs/GaAs high electron mobility transistors, and AlGaAs/InGaAs high electron mobility transistors.

6. The GaAs-based semiconductor field-effect transistor according to claim 1, wherein the lattice constant of said GaAs-based semiconductor material is the lattice constant of GaAs.

* * * * *